US 6,726,766 B2

(12) United States Patent
Mayolet et al.

(10) Patent No.: US 6,726,766 B2
(45) Date of Patent: Apr. 27, 2004

(54) BEADS OF A POLYCRYSTALLINE ALKALI-METAL OR ALKALINE-EARTH METAL FLUORIDE, THEIR PREPARATION, AND THEIR USE FOR PREPARING OPTICAL SINGLE CRYSTALS

(76) Inventors: Alexandre M. Mayolet, 91 rue de Rechevres, 28000 Chartres (FR); Michael A. Pell, 15 rue Caimir Perier, 77300 Fountainebleau (FR)

( * ) Notice: Subject to any disclaimer, the term of this patent is extended or adjusted under 35 U.S.C. 154(b) by 88 days.

(21) Appl. No.: 10/227,489

(22) Filed: Aug. 22, 2002

(65) Prior Publication Data

US 2003/0000456 A1 Jan. 2, 2003

Related U.S. Application Data

(62) Division of application No. 09/679,171, filed on Oct. 4, 2000, now Pat. No. 6,451,106.

(30) Foreign Application Priority Data

Oct. 5, 1999 (FR) ............................... 99 12386

(51) Int. Cl.[7] ............... C30B 11/00; C30B 29/12
(52) U.S. Cl. ............... 117/81; 117/11; 117/83; 252/5; 252/6.5; 252/8.05
(58) Field of Search ............... 117/11, 81, 83; 252/5, 6.5, 8.05

(56) References Cited

U.S. PATENT DOCUMENTS

| 3,372,126 A | 3/1968 | Sandusky et al. ............... 51/298 |
| 3,981,818 A | 9/1976 | Swinehart et al. ............... 252/300 |
| 4,038,201 A | 7/1977 | Hargreaves ............... 252/300 |
| 4,146,379 A | 3/1979 | Copley et al. ............... 65/18 |
| 4,190,487 A | 2/1980 | Pastor et al. ............... 156/617 |
| 4,282,024 A | 8/1981 | Copley et al. ............... 65/144 |
| 4,379,733 A | 4/1983 | Pastor et al. ............... 156/616 |
| 5,441,803 A | 8/1995 | Meissner ............... 428/411.1 |
| 5,578,284 A * | 11/1996 | Chandrasekhar et al. ...... 117/14 |
| 6,117,807 A | 9/2000 | Virkar et al. ............... 501/153 |
| 6,228,165 B1 * | 5/2001 | Baba et al. ............... 117/29 |

FOREIGN PATENT DOCUMENTS

| EP | 0 919 646 | 6/1999 | ............ C30B/29/12 |
| EP | 0 995 820 | 4/2000 | ............ C30B/11/00 |

OTHER PUBLICATIONS

Donald C. Stockbarger, Artificial Fluorite, Journal of the Optical Society of America, vol. 39, No. 9, Sep. 1949.
Jiang Chongyi et al., Growth and Properties of Scintillating Crystal $BaF_2$, Journal of Crystal Growth, 79 (1986) Dec. II, Nos. 1–3, Part 2, Amsterdam, The Netherlands, 720–722.
J.T. Mouchovski et al., Growth of ultra-violet grade $CaF2$ crystals and their application for excimer laser optics, Journal of Crystal Growth 162 (1996) 79–82.
B.E. Kinsman et al., Preparation and Purification of Metal Fluorides for Crystals and Glasses, Materials for Optics and Electronics, vol. 5, 45–51 (1995).

(List continued on next page.)

Primary Examiner—Felisa Hiteshew

(57) ABSTRACT

The present invention is directed to polycrystalline alkali metal or alkaline earth metal beads, in particular $CaF_2$ beads, having a diameter greater than or equal to 100 μm, advantageously between 100 μm and 2 cm, and an apparent density greater than 60%, advantageously at least 90%, of the theoretical density of said fluoride. The invention is also directed to a process for the preparation of the foregoing alkali metal and alkaline earth fluoride beads, and for the preparation of single crystals of said fluorides using the foregoing polycrystalline beads.

26 Claims, 1 Drawing Sheet

OTHER PUBLICATIONS

Datavase WPI, Section Ch, Week 198325, Derwent Publications Ltd., London, GB; AN 1983–60930K, XP002139798 & SU 949 006 (Karag Metal Combine) Aug. 10, 1982.

Dennis R. Cope, Technology Guide: Laser Optics, UV lasers require tough transmissive materials, Jan. 1992, pp. m 107–111.

* cited by examiner

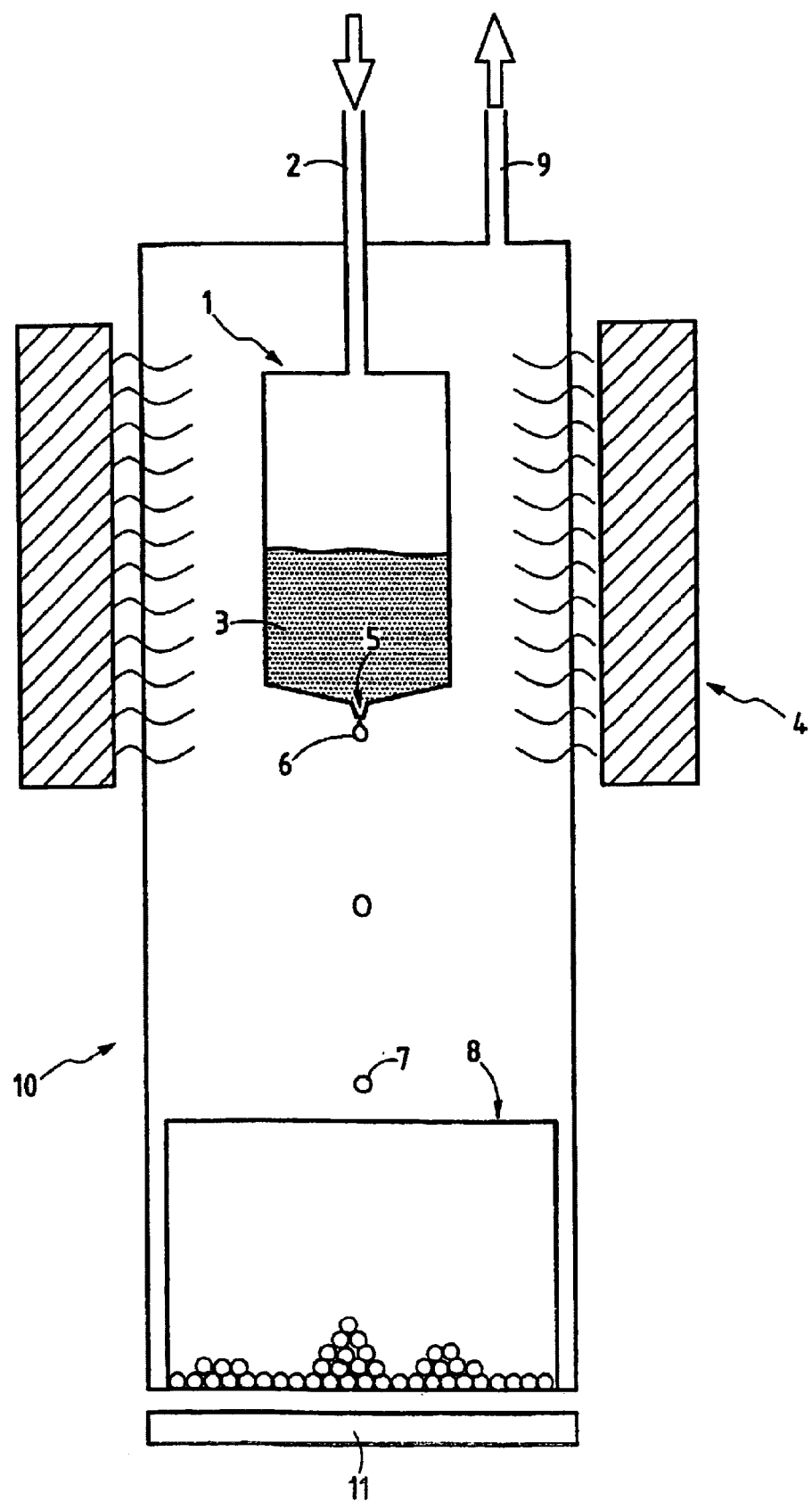

BEADS OF A POLYCRYSTALLINE ALKALI-METAL OR ALKALINE-EARTH METAL FLUORIDE, THEIR PREPARATION, AND THEIR USE FOR PREPARING OPTICAL SINGLE CRYSTALS

This application is a division of application Ser. No. 09/679,171, filed Oct. 4, 2000 now U.S. Pat. No. 6,451,106.

The present invention has the following objectives:

polycrystalline alkali-metal or alkaline-earth metal fluorides, produced in an original form, namely in the form of beads;

a process for the preparation (the conditioning) of said fluorides;

a process for the preparation of single crystals of the corresponding alkali-metal or alkaline-earth metal fluorides that uses polycrystalline fluorides in the aforementioned original form providing an economic process for producing optical fluoride crystal raw material feedstock beads and manufacture of optical fluoride single crystals with optical fluoride crystal raw material feedstock beads.

The present invention was specifically developed for the preparation of fluoride single crystals, particularly optical fluoride single crystals and optical lithography element fluoride single crystal blanks and notably for single crystals of $CaF_2$. Whereas its description more particularly references single crystals of $CaF_2$, the invention is not limited to said crystals.

Single crystals of $CaF_2$ are grown using the Stockbarger technique, which is familiar to those skilled in the art. They are the material of choice as optical element blanks for preparing UV ($\lambda$<250 nm) optical lithography element lenses used in microlithography at 157 and 193 nm, as these lenses must have a below 200 nm high transmission, good laser resistance, low birefringence, and exhibit minimal fluorescence. These crystals must be prepared in the absence of water, air, and all sources of oxygen. This is well known to those skilled in the art. These single crystals are usually prepared in the presence of a fluorinating agent. $PbF_2$ is the most commonly used fluorinating agent, as it is relatively easy to handle, is solid at room temperature, and has a high vapor pressure at the melting point of $CaF_2$. Its reaction with CaO generates PbO, which is subsequently eliminated.

The process for growing large crystals of $CaF_2$ (or any other alkali-metal or alkaline-earth metal fluoride) that are relatively free of defects typically lasts several weeks, particularly for high optical quality optical fluoride single crystals and below 200 nm optical lithography element fluoride single crystal blanks. The cost of the equipment as well as the staging of the crystal-growth process is significant and there is no guarantee of having a successfull result at the end of the growth process. There has therefore long been a concerted effort to augment the yield of this crystal-growth process.

The problem of optimizing the mass of raw material feedstock introduced into the growth furnace with respect to the volume of said furnace has been faced. In practice, high-purity synthetic $CaF_2$ is used as the raw material. This powder typically has an apparent density of only ca. 1.1 g/cm³, whereas the crystals produced have an apparent density close to the theoretical density, i.e. 3.18 g/cm³. Thus if synthetic powder is used directly as the raw material, ⅔ of the volume of the crystal-growth furnace is not used, or at least, not used efficiently. This same problem exists for all of the fluorides, as the crystals grown are denser than the raw material used.

An attempt has therefore been made to increase the density of said raw material before proceeding with the crystal-growth process. Increasing the density of the powder of a mineral salt typically entails its fusion and/or compression.

In the present case:

Compression is not a desirable solution: it requires special equipment, it is liable to introduce impurities, and the compressed masses produced can not be placed in intimate contact with a fluorinating agent before the start of and during the crystal-growth process. In any case, compression alone does not result in material having near theoretical density.

Nor is fusion a satisfactory technique: the products obtained from this process must be ground and grinding invariably affects the purity of the product.

Confronted with this technical problem, namely the optimization of the volume occupied by the raw material in the crystal-growth furnace and more generally, the optimization of the crystal growth process of alkali-metal and alkaline-earth metal fluorides, the inventors developed the original treatment process disclosed herein of said fluorides. Fluorides prepared by this method can be used for crystal growth in an optimized crystal-growth process.

The inventors propose an original procedure for increasing the density of the said fluorides. An advantageous variation of this original process assures both the densification and purification of these fluoride salts.

Said process of densification yields, starting from low-density and notably synthetic raw-material powder, beads with an apparent density that approaches the theoretical density of the corresponding fluoride. These beads have a small diameter. Therefore they do not need to be ground to be brought into efficient contact with a fluorinating agent when they are ultimately loaded into the crystal-growth furnace. Moreover, owing to their shape (quasi-perfect spheres), they can fill the crystal-growth crucible with minimal volume loss. The invention includes optical fluoride crystal raw material feedstock beads, the making of optical fluoride crystal feedstock beads and manufacture of optical fluoride single crystals and UV optical lithography element fluoride crystal blanks with optical fluoride crystal feedstock beads.

Those skilled in the art have certainly already understood the interest of the present invention. Its three aspects—beads, their preparation, and their use in preparing single crystals—are hereafter presented in detail.

As its first object, the present invention concerns a polycrystalline alkali-metal or alkaline-earth metal fluoride, prepared in the shape of beads. These beads have:

a diameter or equivalent diameter (their preparation procedure generates more or less perfect spheres) greater than or equal to 100 $\mu$m, advantageously between 100 $\mu$m and 2 cm; and an apparent density greater than or equal to 60% of the theoretical density of the appropriate fluoride, advantageously at least 90% of the aforementioned theoretical density.

In the context of the invention, there is little interest in optical fluoride crystal feedstock beads of diameter (the word "diameter" is used from now on to cover both the notion of diameter and equivalent diameter) less than 100 $\mu$m or greater than 2 cm. More precisely:

beads with diameter less than 100 $\mu$m are almost equivalent, in terms of density, to powder;

beads with diameter greater than 2 cm are not useful as such for the crystal-growth process. They must be ground to optimize packing and to increase their surface area to volume ratio (so they can be in intimate contact with the fluorinating agent). Such beads are equivalent to the "pieces" obtained from the compression and/or fusion of a powder.

The beads of this invention have an apparent density greater than their corresponding powders. Their apparent density tends toward the theoretical density of the constituent material. The beads of this invention have an apparent density at least equal to 60%, advantageously at least equal to 90%, of the theoretical density of the fluoride in question. Therefore, beads of $CaF_2$ produced according to the present invention have a density greater than or equal to 1.9 g/cm$^3$, advantageously greater than or equal to 3 g/cm$^3$.

The term "apparent density" is familiar to those skilled in the art. The density of a material is constant under given conditions of temperature and pressure. The term "apparent density" is referred to for a solid material dispersed in the form of particles in such a way that its "density" is sensitive to the size and surface state of said particles. In the present context, the apparent density of powders or beads can be defined as the mass of said powders or beads (g) that can be placed into a given volume (cm$^3$), at ambient temperature and without application of pressure.

The optical crystal feedstock densified beads of the invention constitute an excellent solution to the technical problem set forth above: namely the optimization of the mass of raw material introduced in the crystal-growth furnace with respect to the volume of said furnace. In a given volume a greater quantity of raw material pre-conditioned in the form of dense beads can be introduced than of powder of the same raw material. Beads of several different diameters can be produced and by tailoring this distribution of diameters the mass of raw material introduced in a given volume can be further increased (with respect to the mass of raw material in the form of beads all having the same diameter).

In any case, the beads of the invention are more easily manipulated than a powder.

The beads densified by an advantageous variant of the invention have an oxygen content less than 200 ppm, advantageously less than 50 ppm. To obtain such beads, a preparation procedure (the densification procedure with a preferred innovation described in detail below) is implemented under optimum conditions for protection from oxygen and moisture. Concomitant densification and purification of the desired alkali-metal or alkaline-earth metal fluoride is therefore achieved.

The beads of the invention, which advantageously have a low oxygen content, more particularly consist of beads of lithium fluoride (LiF), magnesium fluoride ($MgF_2$), calcium fluoride ($CaF_2$) barium fluoride ($BaF_2$), and especially beads of calcium fluoride ($CaF_2$).

A new densified, and advantageously purified, form of alkali-metal or alkaline-earth metal fluorides is thus proposed according to the present invention, that can be directly used as optical crystal feedstocks to prepare single crystals of said fluorides. This new densified feedstock form can be obtained by the process described hereafter, which constitutes the second object of the present invention. This process characteristically comprises:

the preparation of a molten mass of an alkali-metal or alkaline-earth metal fluoride;

allowing said molten mass to flow through at least one orifice opening into a space; a significant difference being maintained between the temperature of said molten mass and that of said space into which the molten mass is introduced such that at the outlet of said orifice(s) the molten mass is divided into droplets;

the progressive solidification of said droplets as they fall along a vertical axis;

recovering said totally solidified droplets in the form of beads; each of these steps being carried out ill the absence of humidity and oxygen (in order to obtain relatively pure beads).

This process can be summarized as the generation of droplets from a molten mass followed by the solidification of these droplets as they pass through a steep thermal gradient. This process is not per se original. It is original by way of its field of application and the resultant mode of operation.

The molten mass is generally obtained from a powder, notably a high-purity synthetic powder. The molten mass can also be prepared from granules.

The diameter of the orifice(s) is obviously dictated by the desired bead diameter. An orifice diameter approximately 75% that of the desired bead diameter can be recommended. In any case the most influential parameters for bead diameter are:

the diameter of said orifice(s), the temperature and the pressure applied to the molten mass.

The diameter of the orifice or orifices has been mentioned. This use of the singular article is not limiting. It is entirely conceivable, even judicious, that the orifices not all have the same diameter. In this way, beads of different diameters can be prepared during the pouring of one molten mass in a single process.

Beads, with different diameters $\emptyset_1 \ldots \emptyset_n$, $n \geq 2$, can be prepared in a single run (using a single crucible with orifices of corresponding diameters $d_1 \ldots d_n$), or in successive runs (using n crucibles each having orifices of a single given diameter $d_1 \ldots d_n$). Such beads can advantageously be mixed and used to load a crystal-growth furnace.

With respect to the generation of droplets and their solidification, one skilled in the art is apt to optimize the thermal gradient and the height of the solidification zone. The molten mass must obviously be brought to a temperature at which it is homogeneous (for example, a temperature greater than 1380° C. for $CaF_2$). The thermal gradient must also be sufficient to obtain the desired effect (for $CaF_2$, a gradient of at least 200° C. between the temperature of the molten mass and the level where the beads are recovered).

The process of the invention, as described above, is advantageously carried out at reduced pressure. Under such conditions the (virtual) absence of all contaminants ($H_2O$, $O_2$, . . . ) can be ensured and non-reacted species are removed, as well as the by-products of the reaction with a fluorinating agent, when such an agent intervenes.

The intervening atmosphere, advantageously at reduced pressure therefore, can be an inert atmosphere. An argon atmosphere is a possible choice. It is advantageous that the atmosphere be fluorinating. In generating beads in such a fluorinating atmosphere, their constituent material is purified.

There are several ways in which a fluorinating atmosphere can be generated in the vessel in which the beads are produced: at least one fluorinating agent intervenes in the molten mass and/or in the space through which the droplets fall (i.e. the solidification zone). Said fluorinating agent can be introduced in the solid state, advantageously mixed with the raw material, in the molten mass. The fluorinating agent can also be introduced as a gas, advantageously in the solidification zone. It is in no way excluded to introduce the gaseous fluorinating agent above the molten mass, the solid agent in the solidification zone, and the gaseous and/or solid agent(s) in the receptacle containing the molten mass and in the solidification zone. Said agent, in the solid form, is advantageously selected from $PbF_2$, $NH_4F$, $NH_4F.HF$ and polytetrafluoroethylene (Teflon®). Advantageously, $PbF_2$ is used. HF, $F_2$, and $NF_3$ are the preferred gaseous fluorinating agents.

Another advantageous characteristic of the process of the invention is insisted upon when carried out as described above, namely with the introduction of a fluorinating agent. As the droplets formed have a small volume, and as they solidify progressively, the said fluorinating agent ($PbF_2$, for example) has enough time to react and the reaction products (PbO in this case) have ample time to escape from said droplets. The purification is thus performed under optimum conditions.

According to a preferred variant, the bead-preparation process is carried out under conditions such that the pressure in the vessel containing the molten mass is greater than that in the solidification zone. This pressure can be realized using an inert or a fluorinating gas. The pressure serves to accelerate the rate at which the molten material drips through the orifice or through each orifice. It also influences the diameter of the droplets.

The process of this invention is obviously carried out in an adequate vessel, constructed of material(s) capable of withstanding fluoride attack. The vessel comprises:

- a crucible capable of being heated adequately and that can be used to contain the molten mass; the bottom of this crucible has at least one orifice;
- a chamber into which said orifice(s) feed(s); means of heating and/or cooling said chamber being associated to said chamber for generating the desired thermal gradient along its axis. In general the beads are collected in a receptacle placed at the bottom of the chamber.

Said crucible and said chamber can be arranged in several ways. In one variant, the crucible is contained in a compartment above the chamber. In another variant, the crucible is located in the upper part of the chamber. The latter variant is preferred.

To ensure the control of the atmosphere in the crucible, the process is obviously carried out in an enclosed system.

One skilled in the art is able to design an apparatus capable of generating beads according to the process described above. Such an apparatus is described later on in this text with reference to the attached FIGURE.

To retain their purity, the beads should be stored in the absence of air and moisture.

It has been seen that the feedstock beads constitute the raw material of choice for carrying out the optical crystal-growth process. As a third object, the present invention thus relates to such a process; that is a process of preparing an alkali-metal or alkaline-earth metal fluoride single crystal optical blank by the crystallization of the corresponding polycrystalline fluoride into an optical element blank. According to the invention the polycrystalline fluoride is pre-conditioned in the form of feedstock beads such as those described above.

All of the inherent advantages of these beads have been insisted upon.

It has also been indicated that the feedstock beads constituting the charge of an optical crystal-growth furnace are not required to be of the same diameter. With beads of the same diameter, significant optimization of the ratio $$R = \frac{\text{mass of raw material loaded into the furnace}}{\text{furnace volume}},$$

is already achieved.

With beads of different diameter, this ratio can be further increased; smaller beads can fill the voids between the larger beads.

Thus, an advantageous variant of the present invention is to grow crystals using beads of different diameters (at least two different diameters).

As the crystal-growth furnace is rarely completely free from traces of oxygen and/or sources of oxygen (such as $H_2O$), it is strongly recommended to carry out the optical crystal growth in the presence of at least one fluorinating agent, advantageously in the presence of $PbF_2$.

Therefore, an effective quantity of $PbF_2$ can be directly mixed with the beads of this invention, the resultant mixture being a convenient charge for the crystal-growth crucibles. It is re-emphasised here that there is no need to grind said beads.

The crystal-growth process as described above is advantageously performed for the preparation of UV optical lithography single crystals of $CaF_2$ from polycrystalline $CaF_2$ feedstock beads.

The invention claimed herein, particularly its procedural aspect, is illustrated in the attached FIGURE.

Said FIGURE schematically represents an apparatus that can be used for carrying out the procedure described above.

More precisely, said apparatus enables the production of beads according to the invention, that is beads of an alkali-metal or alkaline-earth metal fluoride and notably beads of $CaF_2$ from a mixture: powder of said fluoride+powder of a fluorinating agent. This mixture is referenced 3 in the FIGURE.

It is clear to one skilled in the art that the apparatus schematized in the FIGURE, where the fluorinating agent is a solid at ambient temperature, can be easily adapted to allow the introduction of a gaseous fluorinating agent.

Said apparatus comprises, in metallic vessel 10, a graphite crucible 1 linked to tube 9. Tube 2 serves for regulating the atmosphere in crucible 1 as well as for regulating the drip rate through orifice 5 situated at the bottom of crucible 1.

Said crucible 1 was, in the variant represented, filled with a certain volume of mixture 3 (specified below) and then introduced into vessel 10. Vessel 10 is equipped with a removable bottom (not represented in detail) for loading and unloading operations. Mixture 3 is maintained in the molten state by heaters 4. The molten mass escapes through the orifice 5 in the form of droplets 6. As they fall, said droplets 6 solidify to form beads 7. These beads 7 are collected in receptacle 8.

The crucible 1 and receptacle 8 are arranged in metallic vessel 10; the crucible is situated in the upper part of the vessel 10 and the receptacle 8 is placed at the bottom of the vessel 10.

Vessel 10 and associated heating means 4 can be described as a furnace.

A steep temperature gradient is maintained inside said furnace by way of heating means situated in the upper part and cooling means 11 under the bottom part of vessel 10.

The atmosphere in said furnace is controlled to obtain non-polluted beads. Said atmosphere is a fluorinating atmosphere and in the present variant, a significant vacuum is maintained in the furnace. To this end, appropriate tubing is connected to outlet 9.

The invention is now further illustrated by the following example.

Beads of $CaF_2$ of the present invention were prepared according to the process of the present invention, in an apparatus of the type shown in the attached FIGURE and explained below.

A furnace 4 m in height with metal walls is used. A graphite crucible is loaded (see below) and placed in the upper part; the distance between the bottom of said crucible, which contains six orifices of diameter Ø=1.5 mm and the bottom (retractable) of said furnace is 3 m. The receptacle for the beads sits at the bottom of said furnace. Circulating water is able to cool the bottom of the furnace; the upper extremity can be heated. The temperature at the crucible orifices is 1400° C. whereas the temperature at the bead receptacle at the bottom of the furnace is 650° C.

Before its introduction into said furnace, said crucible was loaded with 50 kg of a mixture of powders: synthetic $CaF_2$ (with an apparent density of 1.1 g/cm³ and containing 300 ppm of oxygen) blended with 2 weight % $PbF_2$.

The furnace is then evacuated. After several hours, a vacuum of $10^{-5}$ mbar is obtained and the upper zone of said furnace is heated at 30° C./h until the temperature at the bottom of the crucible is 1400° C.

When the loaded material has completely melted, a light pressure of anhydrous helium is introduced into said crucible. The vacuum is thus lowered to only $10^{-2}$ mbar. The pressure in said crucible is then adjusted such that six droplets per second emerge from the orifice.

Of course, the outlet manifold has been equipped with adequate means to trap the volatile species generated (notably PbO).

When all of the molten mass has dripped out of the crucible, the gas pressure is reduced in order to reestablish a vacuum of $10^{-6}$ mbar. All traces of $PbF_2$ are removed.

The heating is then interrupted. When the apparatus has cooled to room temperature the vacuum is switched off and the furnace is opened.

The beads obtained have on average:
a diameter of 2 mm,
an apparent density of 3 g/cm³, and
an oxygen content of 45 ppm.

These beads can be stored or used directly.

To use these beads for the crystal growth of $CaF_2$, they are judiciously mixed with $PbF_2$. For example, beads mixed with 0.3 weight % $PbF_2$ are loaded into the growth crucibles.

This $PbF_2$ is added to eliminate any surface oxides and/or all traces of humidity that can be introduced in the storage and/or handling of the beads as well as to counter the deleterious effects of any traces of oxygen present in the crystal-growth furnace.

The invention includes an optical fluoride crystal feedstock for the formation of an optical fluoride crystal having a theoretical calcium fluoride single crystal density. The feedstock is comprised of a plurality of polycrystalline calcium fluoride solid) beads of a diameter or equivalent diameter greater than or equal to 100 μm, advantageously between 100 μm and 2 cm and of an apparent density greater than or equal to 60%, advantageously at least 90% of the optical fluoride crystal theoretical density. The solid beads are non-hollow and nonporous. Preferably the beads consist essentially of Ca and F. The solid beads preferably have a Na impurity level <2 ppm, more preferably Na <0.5 ppm; a K impurity level <2 ppm; more preferably K <1 ppm; a Mn impurity level ≦0.6 ppm; and a Fe impurity level <0.2 ppm; (ppm by wt.).

The invention includes an optical fluoride crystal feedstock for the formation of an optical fluoride crystal having a theoretical lithium fluoride single crystal density. The feedstock is comprised of a plurality of polycrystalline lithium fluoride solid beads of a diameter or equivalent diameter greater than or equal to 100 μm, advantageously between 100 μm and 2 cm and of an apparent density greater than or equal to 60%, advantageously at least 90% of the optical fluoride crystal theoretical density. The solid beads are non-hollow and non-porous. Preferably the beads consist essentially of Li and F. The solid beads preferably have a Na impurity level <2 ppm, more preferably Na <5 ppm; a K impurity level <2 ppm; more preferably K <1 ppm; a Mn impurity level ≦0.6 ppm; and a Fe impurity level <0.2 ppm; (ppm by wt.).

The invention includes an optical fluoride crystal feedstock for the formation of an optical fluoride crystal having a theoretical magnesium fluoride single crystal density. The feedstock is comprised of a plurality of polycrystalline magnesium fluoride solid beads of a diameter or equivalent diameter greater than or equal to 100 μm, advantageously between 100 μm and 2 cm and of an apparent density greater than or equal to 60%, advantageously at least 90% of the optical fluoride crystal theoretical density. The solid beads are non-hollow and non-porous. Preferably the beads consist essentially of Mg and F. The solid beads preferably have a Na impurity level <2 ppm; and more preferably Na <0.5 ppm; a K impurity level <2 ppm; more preferably K <1 ppm; a Mn impurity level ≦0.6 ppm; and a Fe impurity level <0.2 ppm; (ppm by wt.).

The invention includes an optical fluoride crystal feedstock for the formation of an optical fluoride crystal having a theoretical barium fluoride single crystal density. The feedstock is comprised of a plurality of polycrystalline barium fluoride solid beads of a diameter or equivalent diameter greater than or equal to 100 μm, advantageously between 100 μm and 2 cm and of an apparent density greater than or equal to 60%, advantageously at least 90% of the optical fluoride crystal theoretical density. The solid beads are non-hollow and non-porous. Preferably the beads consist essentially of Ba and F. The solid beads preferably have a Na impurity level <2 ppm; more preferably Na <0.5 ppm; a K impurity level <2 ppm; more preferably K <1 ppm; a Mn impurity level ≦0.6 ppm; and a Fe impurity level <0.2 ppm; (ppm by wt.).

The invention includes a method of making an optical fluoride crystal blank. The method includes providing a crystal growth crucible, providing a crystal growth furnace, and providing an optical fluoride crystal feedstock, with the feedstock comprised of polycrystalline solid beads. The method includes loading the optical fluoride crystal feedstock beads into the crystal growth crucible, melting the feedstock beads in the crystal growth crucible and solidifying in the crystal growth furnace, the melted feedstock beads to form an optical fluoride single crystal.

The invention includes a method of making an UV optical lithography element crystal that has a theoretical optical single crystal density. The method includes providing a crystal growth graphite crucible; providing a crystal growth vacuum furnace; and providing an optical fluoride crystal feedstock with the feedstock comprised of polycrystalline solid beads having a diameter ≧100 μm and an apparetit density ≧60% of the theoretical optical single crystal density. The method includes melting the provided feedstock beads in the crystal growth crucible in the crystal growth furnace, and solidifying the melted feedstock into a single crystal optical element fluoride crystal blank.

The invention includes a crystal feedstock. The crystal feedstock is comprised of a solidified molten metal fluoride.

The solidified molten metal fluoride is comprised of fluorine and a single metal M wherein M is chosen from the alkali/alkaline-earth metal group consisting of alkali metals and alkaline-earth metals of the periodic table of elements, col. Group 1 and 2 respectively. The feedstock is in the form of solid non-hollow beads having a diameter or equivalent diameter greater than or equal to 100 µm, advantageously between 100 µm and 2 cm and of an apparent density greater than or equal to 60%, advantageously at least 90% of the theoretical density of said metal fluoride crystal. Preferably the solidified molten metal fluoride consist essentially of M and F. Preferably the feedstock has a metal (M) chloride level less than 1 wt. %. In an embodiment M is an alkaline-earth metal. In a preferred embodiment M is Li. In a preferred embodiment M is Ca. In a preferred embodiment M is Mg. In a preferred embodiment M is Ba. Preferably the beads have a diameter between 100 µm and 2 cm. Preferably the beads have an apparent density of at least 90% of the theoretical density of said metal fluoride. Preferably the feedstock has a Na impurity level <2 ppm; more preferably Na <0.5 ppm; a K impurity level <2 ppm; more preferably K <1 ppm; a Mn impurity level ≦0.6 ppm, and a Fe impurity level <0.2 ppm; (ppm by wt.)

It will be apparent to those skilled in the art that various modifications and variations can be made to the present invention without departing from the spirit and scope of the invention. Thus, it is intended that the present invention covers the modifications and variations of this invention provided they come within the scope of the appended claims and their equivalents.

What is claimed is:

1. A method of making an optical fluoride crystal feedstock said method comprising:
   providing a crystal growth crucible,
   providing a crystal growth furnace,
   providing an optical fluoride crystal feedstock, said feedstock comprised of polycrystalline solid beads,
   loading said optical fluoride crystal feedstock beads into said crystal growth crucible, melting said feedstock beads in said crystal growth crucible and solidifying in said crystal growth furnace said melted feedstock beads in said crucible to form an optical fluoride single crystal.

2. A method as claimed in claim 1 wherein providing said optical fluoride crystal feedstock solid beads includes:
   melting a fluoride of an alkali metal or alkaline-earth metal to provide a molten mass of said fluoride in the absence of moisture and oxygen;
   allowing said melted molten mass to flow through at least one orifice emerging into a space in the absence of moisture and oxygen; a consequent difference in temperature being maintained between the temperature of said melted molten mass and that of said space into which said melted molten mass is introduced, so that at the outlet of said orifice(s), said melted molten mass becomes divided into droplets;
   allowing the said droplets to fall along the vertical axis of said space in the absence of moisture and oxygen, causing their progressive solidification;
   recovering the totally solidified droplets in the form of polycrystalline solid beads.

3. The method according to claim 2, characterised in that it is carried out under an inert atmosphere.

4. The method according to claim 2, characterised in that it is carried out under a fluorinating atmosphere with at least one fluorinating agent.

5. The method according to claim 4, characterized in that said fluorinating agent is a solid added to said fluoride.

6. The method according to claim 5, wherein said at least one solid fluorinating agent is selected from the group consisting of $PbF_2$, $NH_4F$, $NF_4F.HF$ and polytetrafluoroethylene.

7. A method according to claim 4, that said fluorinating characterised agent is a gas.

8. The method according to claim 7, wherein said at least one fluorinating agent is selected from the group consisting of HF, $F_2$ and $NF_2$.

9. The method according to claim 4, with said at least one fluorinating agent intervening at the level of said molten mass.

10. The method according to claim 4, with said at least one fluorinating agent intervening in said space.

11. The method according to claim 4, with said at least one fluorinating agent intervening at the level of said molten mass and in said space.

12. The method according to claim 2, characterised in that said molten mass is subjected to a pressure greater than that existing within said space.

13. The method according to claim 2, wherein said fluoride is selected from the group consisting of calcium fluoride, barium fluoride, magnesium fluoride and lithium fluoride.

14. A method of making an UV optical lithography element crystal said crystal having a theoretical optical single crystal density, said method comprising:
   providing a crystal growth graphite crucible,
   providing a crystal growth vacuum furnace,
   providing an optical fluoride crystal feedstock, said feedstock comprised of polycrystalline solid beads, said beads having a diameter ≧100 µm and an apparent density ≧60 % of said theoretical optical single crystal density, melting said provided feedstock beads in said crystal growth crucible in said crystal growth furnace,
   solidifying said melted feedstock into a single crystal optical element fluoride crystal blank.

15. A method as claimed in claim 14 wherein providing said optical fluoride crystal feedstock solid beads includes:
   melting a fluoride of an alkali metal or alkaline-cart metal to provide a molten mass of said fluoride in the absence of moisture and oxygen;
   allowing said melted molten mass to flow through at least one orifice emerging into a space in the absence of moisture and oxygen; a consequent difference in temperature being maintained between the temperature of said melted molten mass and that of said space into which said melted molten mass is introduced, so that at the outlet of said orifice(s), said melted molten mass becomes divided into droplets;
   allowing the said droplets to fall along the vertical axis of said space in the absence of moisture and oxygen, causing their progressive solidification;
   recovering the totally solidified droplets in the form of polycrystalline solid beads.

16. The method according to claim 14, characterized in that it is carried out under an inert atmosphere.

17. The method according to claim 14, characterised in that it is carried out under a fluorinating atmosphere with at least one fluorinating agent.

18. The method according to claim 17, characterized in that said at least one fluorinating agent is a solid added to said fluoride.

19. The method according to claim 18, wherein said at least one solid fluorinating agent is selected from the group consisting of $PbF_2$, $NH_4F$, $NH_4F.HF$ and polytetrafluoroethylene.

20. The method according to claim 18, wherein said at least one fluorinating agent is HF, $F_2$, and $NF_3$.

21. The method according to claim 17, characterised in that said fluorinating agent is a gas.

22. The method according to claim 17, with said at least one fluorinating agent intervening at the level of said molten mass.

23. The method according to claim 17, with said at least one fluorinating agent intervening in said space.

24. The method according to claim 17, with said at least one fluorinating agent intervening at the level of said molten mass and in said space.

25. The method according to claim 15, characterised in that said molten mass is subjected to a pressure greater than that existing within said space.

26. The method according to claim 15, wherein said fluoride is one selected from the group consisting of calcium fluoride, barium fluoride magnesium fluoride and lithium fluoride.

* * * * *

UNITED STATES PATENT AND TRADEMARK OFFICE
CERTIFICATE OF CORRECTION

PATENT NO.    : 6,726,766 B2
DATED         : April 27, 2004
INVENTOR(S)   : Alexandre Mayolet et al.

It is certified that error appears in the above-identified patent and that said Letters Patent is hereby corrected as shown below:

<u>Title page,</u>
Item [73], Assignee, should read -- Corning Incorporated --

Signed and Sealed this

Twenty-seventh Day of July, 2004

JON W. DUDAS
*Acting Director of the United States Patent and Trademark Office*